United States Patent [19]

Takeshima

[11] 4,138,708
[45] Feb. 6, 1979

[54] DRIVE CIRCUIT FOR SOLENOID PUMP

[75] Inventor: Sadao Takeshima, Higashi Matsuyama, Japan

[73] Assignee: Jidoshakiki Co., Ltd., Tokyo, Japan

[21] Appl. No.: 825,198

[22] Filed: Aug. 17, 1977

[30] Foreign Application Priority Data

Nov. 26, 1976 [JP] Japan .............................. 51-157983[U]
Dec. 23, 1976 [JP] Japan .............................. 51-173092[U]

[51] Int. Cl.$^2$ ........................................... H01H 47/00
[52] U.S. Cl. ................................ 361/156; 307/252 F; 361/198; 361/203
[58] Field of Search ............... 361/156, 198, 203, 196, 361/197, 155, 205; 307/252 F; 417/416, 417

[56] References Cited

U.S. PATENT DOCUMENTS

| 2,907,929 | 10/1959 | Lawson, Jr. | 361/156 |
| 3,562,598 | 2/1971 | Dodd | 361/198 |
| 3,582,716 | 6/1971 | Traina | 361/198 |
| 3,942,078 | 3/1976 | Simeau | 361/156 |
| 4,045,714 | 8/1977 | MacLeod | 361/156 |

FOREIGN PATENT DOCUMENTS 111939  1964  Czechoslovakia ...................... 361/156

Primary Examiner—Patrick R. Salce
Attorney, Agent, or Firm—Blanchard, Flynn, Thiel, Boutell & Tanis

[57] ABSTRACT

A drive circuit for a solenoid pump comprises a series combination of a pump solenoid and a capacitor connected through a rectifier circuit with an a.c. source. The solenoid is shunted by another rectifier poled to pass a charging current to the capacitor. A thyristor is connected across the series combination, and is triggered into conduction, whereupon it short-circuits the series combination to permit a discharge of the capacitor through the solenoid and to prevent a current flow from the source to the capacitor, thus allowing a uniform control of the energy discharged by the capacitor. A trigger circuit for the thyristor comprises a relaxation oscillator including a programmable unijunction transistor, the conduction of which is controlled inversely to fluctuations in the source voltage.

5 Claims, 10 Drawing Figures

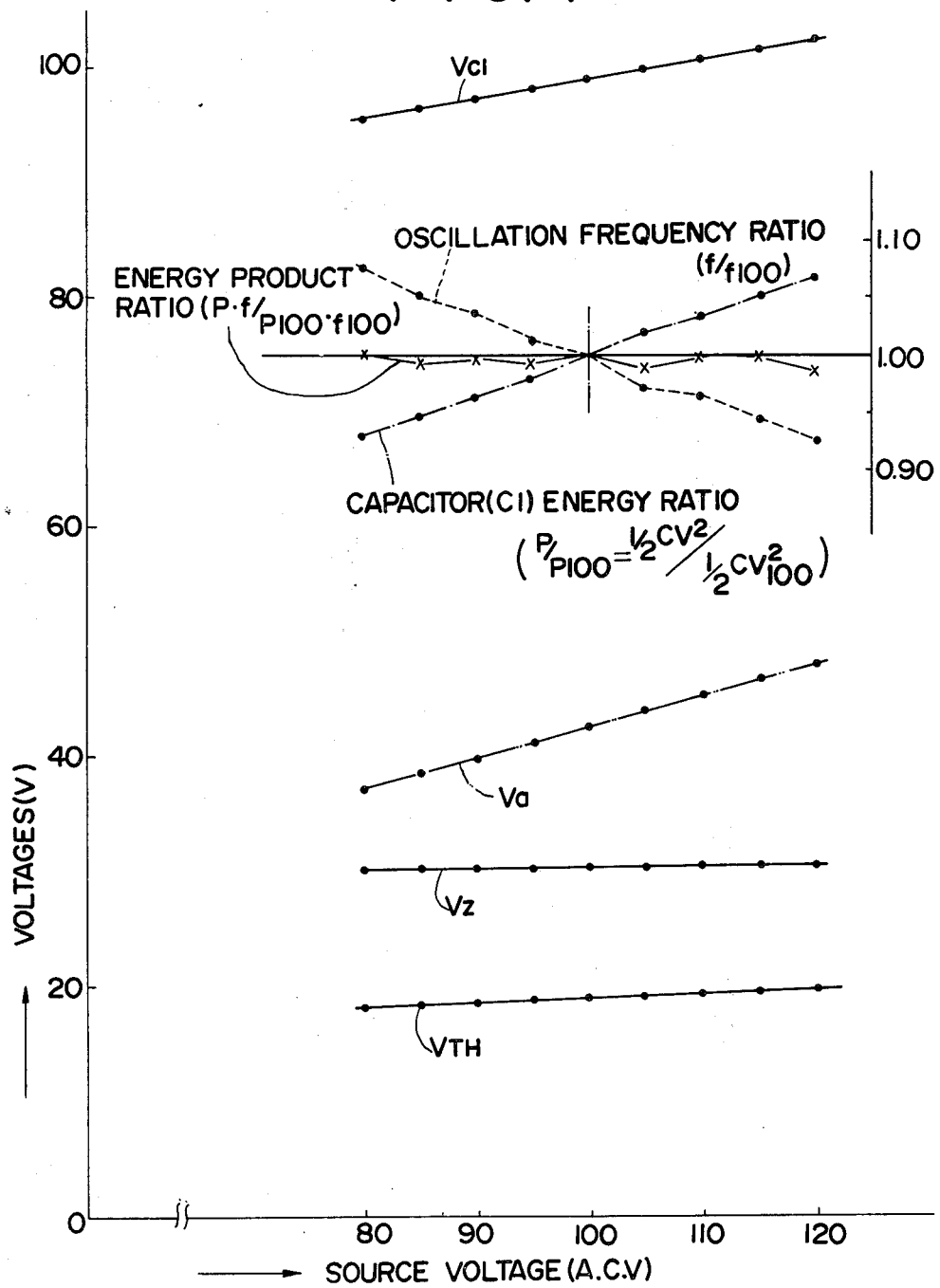

DRIVE CIRCUIT FOR SOLENOID PUMP

PRIOR ART STATEMENT

Japanese Utility Model Publication No. 41523/1974, Patent Publication No. 24726/1976, Laid-open Utility Model Application No. 33302/1975 and pending Utility Model Application No. 84541/1973, assigned to the applicant, all relate to an electromagnetic or solenoid pump which may be operated with the drive circuit of the invention. U.S. Pat. No. 3,606,595 is a counterpart of Japanese Utility Model Publication No. 41523/1974. U.S. Pat. No. 3,514,228 discloses an electromagnetic pump having a solenoid coil which is fed from a half wave rectifier connected with an a.c. source. U.S. Pat. No. 3,502,026 shows an electromagnetic pump unit including a rectifier, but which is not directed to a flow rate control.

BACKGROUND OF THE INVENTION

The invention relates to a drive circuit for a solenoid pump of a type controlling a small flow and in which a solenoid coil is energized intermittently to cause a reciprocatory motion of a piston to achieve a fluid supply.

Delivery and control of a fuel flow to a room heater usually takes place either through the use of a solenoid pump or through the combination of the use of a fluid head to deliver the fuel and a flow control valve which controls the flow rate. In the former arrangement, a pulse from an oscillator may be fed to the solenoid pump for control purposes, but the control circuit required to control the flow rate is complex. In the latter, the flow control valve of a mechanical type must be equipped with an orifice of a greatly reduced size in order to permit a control over a small flow rate, presenting difficulties in its manufacture and maintenance of the required precision.

To accommodate for this situation, there is provided a drive circuit for a solenoid pump which is simple in arrangement and which facilitates flow control. Such an arrangement is illustrated in FIG. 1, where an a.c. source A.C. is shown connected with one end of a series combination of a rectifier SR1 and resistor R1, the other end of which is connected with one end of a solenoid coil 1 of a solenoid pump. The other end of the coil 1 is connected with a thyristor SCR1, which is in turn connected with the other terminal of the a.c. source. A capacitor C1 is connected in shunt with the series combination of coil 1 and SCR1. The gate of thyristor SCR1 is connected with a shunt resistor R4, the other end of which is connected with the other terminal of the source. The gate is also connected with a trigger circuit which comprises a variable resistor VR1, capacitor C2 and trigger diode TD. A diode SR2 is connected through current adjusting resistors R2 and R3 with the trigger circuit, and prevents a reverse flow of the charge on the capacitor C2 to the source. A Zener diode ZD1 is connected at its one end with the junction between the resistors R2, R3 and with the other terminal of the source at its other end, and functions to supply a constant voltage to the trigger circuit. A capacitor C3 may be connected in shunt with the Zener diode for maintaining the constant voltage. If desired, the resistor R1 may be formed by a variable resistor.

In operation, the alternating current from the source is rectified by rectifier SR1 into a d.c. current, which is passed through the resistor R1 to the capacitor C1. The capacitor C1 may be charged to the peak value of the a.c. source in a time interval $T_{CM}$ which is determined by the resistance of resistor R1 and the capacitance of capacitor C1. Such time interval may be several a.c. cycles. In the trigger circuit, the capacitor C2 is charged until the voltage thereacross reaches a threshold voltage of the trigger diode TD, whereupon diode TD conducts to cause the capacitor C2 to discharge through the resistor R4, thereby developing a trigger pulse which is applied to the gate of the thyristor SCR1. This trigger pulse occurs repeatedly with a period Ttr which depends on the breakdown voltage of the Zener diode, resistance of resistors R3, VR1, capacitance of capacitor C2 and the threshold voltage of the trigger diode TD. Thus, the period Ttr can be varied by the adjustment of the variable resistor VR1.

In response to the trigger pulse, the thyristor SCR1 conducts, whereby the capacitor C1 discharges through the solenoid 1. Current ceases to flow through the solenoid 1 during the negative half cycle of the source, rendering the thyristor SCR1 non-conductive. The solenoid 1 can be energized by a discharge current of the capacitor C1 after it has been charged to the peak value of the source, if the number of energizations per minute of the solenoid or the interval Ttr is adjusted by means of the variable resistor VR1, such that $T_{CM}$ < Ttr.

The conventional drive circuit described above is simple in arrangement and provides a desired operating characteristic while reducing the number of parts required. It is to be noted that when operated with a commercial frequency, the solenoid pump will achieve a discharge performance which is generally greater than is desired. In order to reduce the frequency, an oscillator employing a pair of thyristors is often provided which is d.c. operated by conversion from the source of a commercial frequency. As compared with such an arrangement, it will be seen that the described circuit requires a single thyristor and hence a single trigger circuit, thus simplifying the circuit arrangement and avoiding the need for the provision of a high capacity d.c. source. The flow rate can be controlled by changing the period of the trigger pulse, which is conveniently accomplished by adjusting the variable resistor VR1.

FIG. 2a shows the mechanical construction of an exemplary solenoid pump. Specifically, it includes a hollow core 8 carrying a valve body 9 and disposed slidably inside the solenoid 1 so as to be excited by the latter. The pump also includes a pair of permanent magnets 4, 5 disposed in axial alignment on opposite sides of the core with the opposite magnetic poles thereof in opposing relationship, and a pair of springs 6, 7 disposed between the respective magnets and the core. A check valve 10 is included in the inlet passage of the pump. The pump is shown in longitudinal section in FIG. 2a, while FIGS. 2a and 2b show schematically the pump when the solenoid 1 is energized and de-energized, respectively. When the solenoid 1 is energized, the core 8 is magnetized to the polarity shown, and experiences an attraction by the magnet 4 and a repulsion by the magnet 5, thus moving upward as shown in FIG. 2b. When the solenoid 1 is de-energized, the core 8 would tend to maintain its position shown in FIG. 2b, but the spring 6 urges it downwardly toward the magnet 5, until it reaches a neutral position shown in FIG. 2c where the resilience of the springs 6, 7 is balanced.

In the prior art drive circuit, it will be understood that the solenoid 1 will be energized from the a.c.

source directly in addition to the energization by the discharge of the capacitor C1 upon conduction of the thyristor SCR1, since it is in series circuit relationship with the source. Because the solenoid 1 includes a certain resistance, the capacitor C1 will be fed with a charging current during its discharge. This results in a failure of the thyristor SCR1 to turn off at the zero crossover of the source voltage. This in turn requires the choice of a relatively high resistance for the resistor R1, which, however, prevents a rapid charging of the capacitor C1. As a result, a limit is imposed on the achievable range of the adjustment of the energization cycle of the solenoid 1 and hence the drive rate of the pump by the variable resistor VR1.

In addition, a fluctuation in the source voltage results in a variation in the energy stored on or discharged from the capacitor C1, leading to a varying discharge per unit time of the solenoid pump.

SUMMARY OF THE INVENTION

It is an object of the invention to provide a drive circuit for a solenoid pump which permits an adjustment of the drive rate over an increased extent and which facilitates the circuit design.

It is another object of the invention to provide a drive circuit for a solenoid pump of the type described which additionally avoids a variation in the discharge from the pump with a fluctuation of the source voltage.

In accordance with the invention, a drive circuit for a solenoid pump comprises a solenoid and a capacitor connected in series relationship with a power source. The solenoid is shunted by a rectifier which is poled to charge the capacitor. A thyristor is connected across the series combination of the solenoid and the capacitor to form a discharge path for the latter when it conducts. This arrangement prevents a current flow from the source through the solenoid and the capacitor during the discharge period, whereby the discharge of the capacitor is maintained at a uniform rate, permitting an adjustment of the drive rate over an increased extent.

In accordance with another aspect of the invention, a trigger circuit for the thyristor comprises a relaxation oscillator including a programmable unijunction transistor (PUT). The anode of the PUT is supplied with a reference voltage established by a Zener diode, while to the gate thereof is applied a non-stabilized voltage which is subject to the influence of a fluctuation in the source voltage. An oscillation output is derived from the cathode of the PUT and is applied to the gate of the thyristor for conduction thereof. When the source voltage fluctuates, the oscillation frequency of the trigger circuit varies to cancel a change in the capacitor voltage which occurs as a result of the source voltage fluctuation, thereby achieving a compensation of the pump discharge.

BRIEF DESCRIPTION OF THE DRAWINGS

FIGS. 2b and 2c are schematic views illustrating the operation of the pump shown in FIG. 2a;

FIG. 7 graphically shows various voltages appearing in the circuit of FIG. 6 as plotted against the source voltage.

DETAILED DESCRIPTION OF EMBODIMENTS

Figure 1:
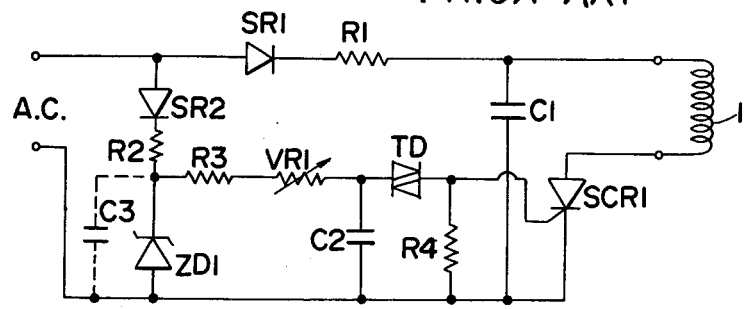
FIG. 1 is a circuit diagram of a conventional drive circuit for a solenoid pump.
Figure 3:
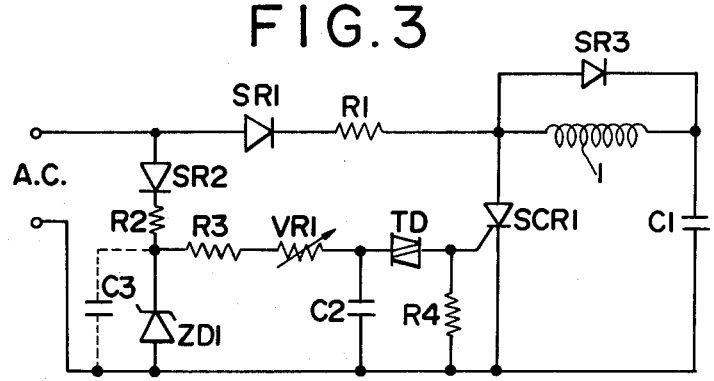
FIGS. 3 to 5 are circuit diagrams of several embodiments of the invention.

Referring to FIG. 3, there is shown a circuit diagram of one embodiment of the invention. The circuit arrangement is generally similar to that shown in FIG. 1. However, in accordance with the invention, the solenoid 1 and the capacitor C1 are connected in series with each other rather than in parallel relationship as shown in FIG. 1. Specifically, the series combination of the solenoid 1 and the capacitor C1 is connected between the remote end of the resistor R1 from the source and the other terminal of the latter, and the thyristor SCR1 is connected in shunt with the series combination. Additionally, is solenoid 1 is shunted by a rectifier SR3, through which the capacitor C1 is charged. In operation, when the thyristor conducts, a discharge path for the capacitor C1 is completed through the solenoid 1 and the thyristor SCR1, thereby energizing the solenoid 1. Since the thyristor short-circuits the series combination 1, C1, no current flows from the source to the solenoid 1 or the capacitor C1. The thyristor turns off at the negative going crossover of the source voltage. Thus the resistor R1 may be adjusted to any value, independently from the resistance of the solenoid 1, to provide a desired charging period for the capacitor C1 while maintaining the energization of the solenoid 1 at a constant level, and a reliable turn-off of the thyristor is achieved. The discharge cycle of the capacitor C1 can be established as desired by the variable resistor VR1. In this manner, the drive rate of the solenoid pump can be adjusted over an increased range.

Figure 4:
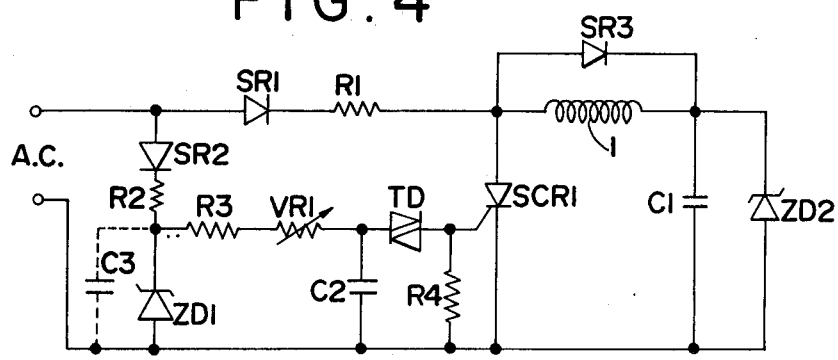
Figure 2A:
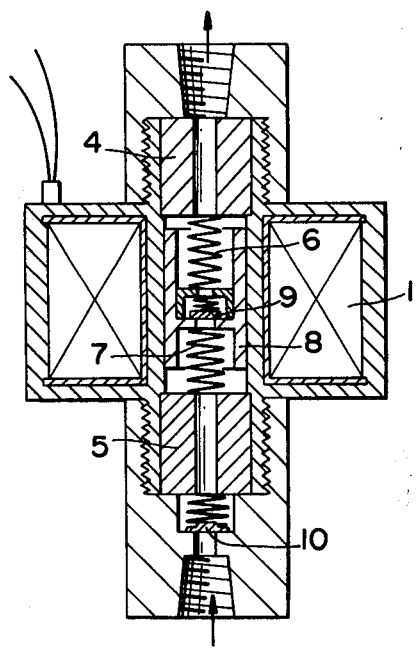
FIG. 2a is a longitudinal section of an exemplary solenoid pump.
Figure 2B:
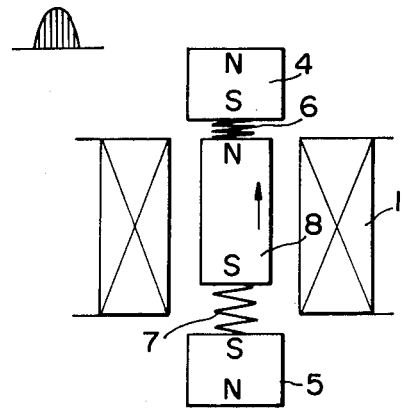
Figure 2C:
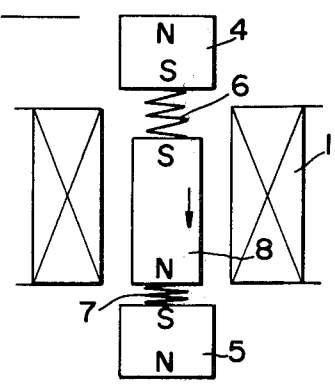
Figure 5:
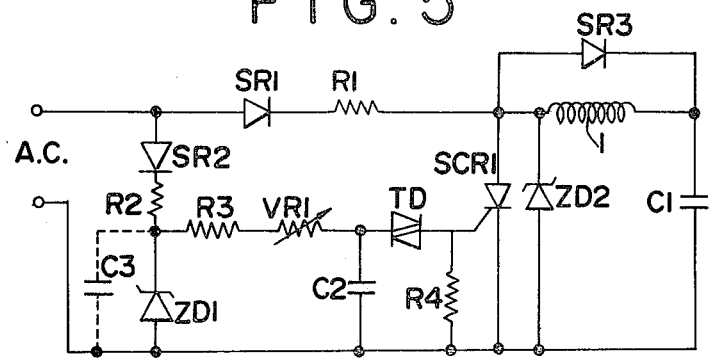

FIGS. 4 and 5 show modifications in which a Zener diode ZD2 is connected in shunt with the capacitor C1 or the series combination of the solenoid 1 and the capacitor C1 in order to maintain the energy stored on the capacitor constant for fluctuations in the source voltage.

Figure 6:
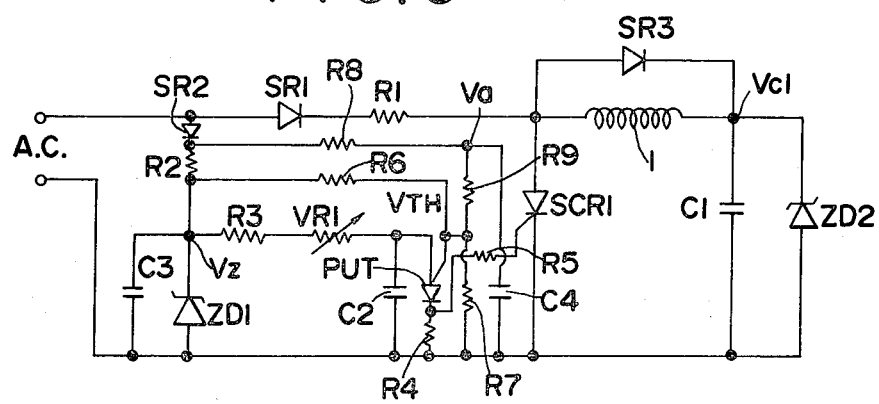
FIG. 6 is a circuit diagram of another embodiment of the invention.

Referring to FIG. 6, there is shown another embodiment of the invention which utilizes the general circuit arrangement shown in FIG. 4, except that the trigger circuit is modified by substituting a programmable unijunction transistor PUT for the trigger diode TD of FIG. 4. Specifically, the PUT is connected in series with the resistor R4 across the capacitor C2, and the junction between the PUT and resistor R4 is connected through a resistor R5 with the gate of the thyristor SCR1. A pair of series resistors R6, R7 are connected between the junction between the resistors R2, R3 and the other terminal of the source, and the junction between the resistors R6, R7 is connected with the gate of the PUT. Another pair of resistors R8, R9 are connected between the junction between the diode SR2 and resistor R2 and the gate of the PUT in order to supply thereto a voltage which partly varies with a fluctuation in the source voltage. The PUT conducts when the voltage across the capacitor C2 exceeds the potential at the junction between the resistors R6, R7, thereby developing a trigger voltage for the thyristor SCR1 across the resistor R4. Thus it will be seen that the oscillation frequency of PUT decreases as the source voltage increases, and increases as the source voltage decreases.

FIG. 7 graphically shows a variation of the charged voltage Vc1 on the capacitor C1 plotted against a varying source voltage. The voltage Va developed across a capacitor C4, connected across the series combination of resistors R9, R7, is also graphically shown as varying in a manner similar to Vc1. The voltage Vz across the Zener diode ZD1 is shown as constant, while the gate voltage $V_{TH}$ of the PUT varies in proportion to the fluctuation in the source voltage. As a result, the oscillation frequency of the PUT varies inversely with the fluctuation of the source voltage, as shown by a curve in broken lines in FIG. 7. The stored energy on the capacitor C1 varies in proportion to the square of the fluctuation of the source voltage, as shown in chain lines. Thus it will be seen that by choosing circuit parameters such that the oscillation frequency varies substantially in inverse proportion to the square of the voltage fluctuation, the energy discharged from the capacitor C1 per unit time can be maintained substantially constant, as shown in solid line in FIG. 7.

Figure 8:
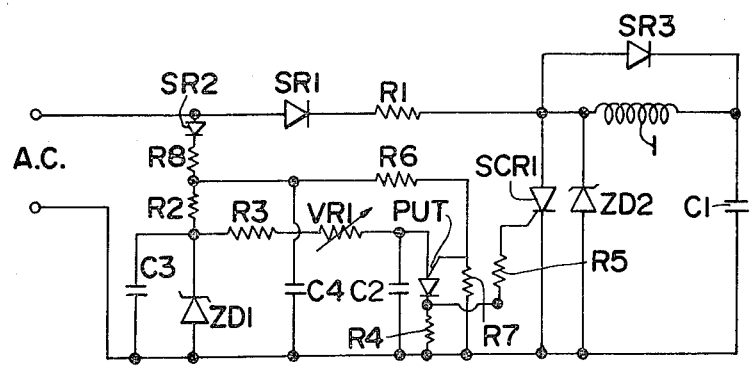
FIG. 8 is a circuit diagram of a further embodiment of the invention.

FIG. 8 shows a further embodiment of the invention which is similar to that shown in FIG. 6 except that the resistor R9 is omitted. Additionally, the resistor R8 is connected in series with the resistor R2, and the resistor R6 has its one end connected with the junction between the resistors R8, R2. The capacitor C4 is also connected with this junction. This embodiment operates in a manner similar to the embodiment shown in FIG. 6.

What is claimed is:

1. A drive circuit for a solenoid pump comprising a series combination of a rectifier and a resistor connected between one terminal of an a.c. source and one end of the solenoid of the pump, another rectifier connected in shunt with the solenoid, a thyristor connected between said one end of the solenoid and the other terminal of the a.c. source, a capacitor connected between the other end of the solenoid and the other terminal of the a.c. source, and a trigger circuit for supplying a trigger pulse to the thyristor to turn it on, thereby causing the solenoid to be energized by electrical energy stored on the capacitor as it discharges through the thyristor, wherein said trigger circuit is formed as a relaxation oscillator including a programmable unijunction transistor and having an oscillation frequency which varies inversely with a fluctuation in said source voltage, said thyristor being rendered conductive in response to an oscillation output from said trigger circuit, whereby the energy discharged by said capacitor per unit time is maintained substantially constant despite a fluctuation in said source voltage.

2. A drive circuit according to claim 1 in which said another rectifier is poled to pass a charging current to the capacitor.

3. A drive circuit according to claim 1, further including a Zener diode connected in parallel relationship with the capacitor.

4. A drive circuit according to claim 1 in which the trigger circuit comprises a second capacitor, a charging circuit for the second capacitor, said programmable unijunction transistor being connected in shunt with the second capacitor, and a voltage divider connected across the source for supplying a voltage to the gate of the transistor which varies with a fluctuation in the source voltage.

5. A drive circuit according to claim 4 in which the charging circuit includes a Zener diode for establishing a fixed voltage to which the second capacitor is charged, thereby controlling the conduction of the transistor in accordance with a fluctuation in the source voltage.

* * * * *